United States Patent
Kim (10) Patent No.: US 9,437,255 B2
(45) Date of Patent: Sep. 6, 2016

(54) SEMICONDUCTOR DEVICE CONTROLLING REFRESH OPERATION FOR PREVENTING WORDLINE DISTURBANCE

(71) Applicant: SK hynix Inc., Icheon-si Gyeonggi-do (KR)

(72) Inventor: Joon-Woo Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 234 days.

(21) Appl. No.: 14/258,206

(22) Filed: Apr. 22, 2014

(65) Prior Publication Data

US 2014/0317344 A1  Oct. 23, 2014

(30) Foreign Application Priority Data

Apr. 22, 2013  (KR) .................. 10-2013-0043885

(51) Int. Cl.
  *G11C 8/12* (2006.01)
  *G11C 7/02* (2006.01)
  *G11C 8/10* (2006.01)
  *G11C 11/406* (2006.01)

(52) U.S. Cl.
  CPC . *G11C 7/02* (2013.01); *G11C 8/10* (2013.01); *G11C 11/40603* (2013.01); *G11C 11/40611* (2013.01)

(58) Field of Classification Search
  CPC ................................ G11C 7/1006; G11C 8/12
  USPC ........................................ 365/189.07, 230.02
  See application file for complete search history.

(56) References Cited

U.S. PATENT DOCUMENTS

| | | | |
|---|---|---|---|
| 7,212,435 B2 | 5/2007 | Rudeck et al. | |
| 7,244,995 B2 | 7/2007 | Madan | |
| 7,663,933 B2 * | 2/2010 | Tsukazaki | G11C 16/3418 365/185.25 |
| 7,933,161 B2 * | 4/2011 | Miyamoto | G11C 11/22 365/145 |
| 8,923,084 B1 * | 12/2014 | Song | G11C 11/4063 365/222 |
| 9,087,554 B1 * | 7/2015 | Park | G11C 11/406 |
| 9,122,598 B2 * | 9/2015 | Moon | G06F 12/00 |
| 9,129,672 B2 * | 9/2015 | Moon | G11C 11/4078 |
| 9,183,917 B1 * | 11/2015 | Cho | G11C 11/406 |
| 2003/0231540 A1 * | 12/2003 | Lazar | G11C 11/406 365/222 |
| 2007/0070764 A1 * | 3/2007 | Miyamoto | G11C 11/22 365/222 |
| 2015/0170728 A1 * | 6/2015 | Jung | G11C 8/08 365/222 |

* cited by examiner

*Primary Examiner* — Son Mai (74) *Attorney, Agent, or Firm* — William Park & Associates Ltd.

(57) ABSTRACT

A semiconductor device may include a storage unit configured to store a number of times a first command has been provided to a memory cell array, a control unit configured to generate a second command operable to activate at least one word line in the memory cell array based on a comparison of the number stored at the storage unit with a threshold value, when the first command is received, and a selection unit configured to select one of the first command and the second command based on a result of the comparison and transmit the selected command to the memory cell array.

23 Claims, 9 Drawing Sheets

SEMICONDUCTOR DEVICE CONTROLLING REFRESH OPERATION FOR PREVENTING WORDLINE DISTURBANCE

CROSS-REFERENCE TO RELATED APPLICATIONS

The present application claims priority of Korean Patent Application No. 10-2013-0043885, filed on Apr. 22, 2013, which is incorporated herein by reference in its entirety.

BACKGROUND

1. Field

Various embodiments relate to a semiconductor device, and more particularly, to a semiconductor device configured to prevent possible damage of data stored in a cell.

2. Description of the Related Art

Increases in the density of memory cells in semiconductor memory devices often lead to increases in a coupling effect between adjacent word lines disposed in a semiconductor memory device. When the number of operations that cause a specific word line to toggle between an activated state and a deactivated state increases, the data stored in cells coupled to an adjacent word line may be damaged due to the coupling effect between the word lines.

In dynamic random access memory devices (DRAM), electromagnetic waves generated when a specific word line is toggled may result in the introduction of electrons into a capacitor of a cell coupled to an adjacent word line or may result in the discharge of electrons from the capacitor and potentially corrupt the data stored in that cell.

In many cases, data stored in a cell in a DRAM device may be damaged by word line disturbances that may occur prior to a refresh period.

SUMMARY

In an embodiment, a semiconductor device may include a storage unit configured to store a number of times a first command has been provided to a memory cell array, a control unit configured to generate a second command operable to activate at least one word line in the memory cell array based on a comparison of the number stored at the storage unit with a threshold value, when the first command is received, and a selection unit configured to select one of the first and second commands based on a result of the comparison and transmit the selected command to the memory cell array.

In an embodiment, a semiconductor memory device may include a memory cell array, a storage unit configured to store a number of times a first command has been provided to the memory cell array from a memory controller, a control unit configured to generate a second command operable to activate at least one word line in the memory cell array based on a comparison of the number stored at the storage unit with a threshold value, and a selection unit configured to select one of the first and second commands based on a result of the comparison and transmit the selected command to the memory cell array.

DETAILED DESCRIPTION

Various embodiments will be described below in more detail with reference to the accompanying drawings. Throughout the disclosure, like reference numerals refer to like parts throughout the various figures and various embodiments.

A semiconductor memory device includes a memory cell array having word lines. Examples of the semiconductor memory device may include, but are not limited to, a volatile memory device and a nonvolatile memory device. An example of a volatile memory device is a DRAM. Examples of nonvolatile memory devices include, but are not limited to, a MRAM, a STT-RAM, a flash memory, a PCRAM, and a ReRAM.

Figure 1:
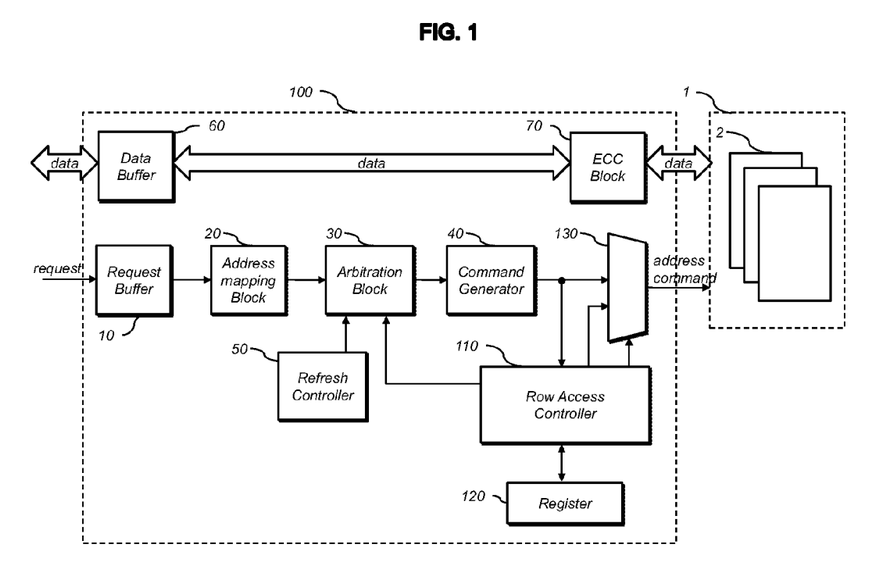
FIG. 1 is a block diagram representation of an embodiment of a memory controller.

FIG. 1 is a block diagram representation of an embodiment of a memory controller 100.

Examples of the memory controller 100 include, but are not limited to, a memory controller device and a processor including a memory controller.

An embodiment of the memory controller 100 may include a row access controller 110 and a register 120. The memory controller 100 is electrically coupled to a semiconductor memory device 1. The semiconductor memory device 1 includes a plurality of memory cell arrays 2.

The memory controller 100 may include a request buffer 10, an address mapping block 20, an arbitration block 30, a command generator 40, a refresh controller 50, a data buffer 60, and an ECC block 70. The request block 10 may temporarily store an external request received from a device external to the memory controller 100. The request may include a requested address. The address mapping block 20 may convert the requested address into an address of a memory cell array 2. The arbitration block 30 may determine a processing order for a plurality of received external requests. The command generator 40 may generate a control command to the semiconductor memory device 1 in accordance with a received request. The refresh controller 50 may manage a refresh operation of the semiconductor memory device 1. The data buffer 60 may temporarily store data. The ECC block 70 may add and store a data parity in the memory cell array 2, and determine whether an error exists in data received from the memory cell array 2, using the stored data parity. When a request for the semiconductor memory device 1 is received at the row access controller 110 at the memory controller 100, the row access controller 110 may refer to information indicating a data damage risk associated with the requested address and determine whether data stored in cells coupled to a word line adjacent to the word line within the memory cell array 2 corresponding to the requested address are likely to be corrupted.

When determining whether the data stored in the cells of the adjacent word line are likely to be damaged, the row access controller 110 may issue a command to the semiconductor memory device 1 to restore the data stored in one or more of the cells coupled to the adjacent word line.

In order to determine a data damage risk, the row access controller 110 may check the number of times the word lines of the memory cell array 2 associated with the requested address have been accessed, and determine whether the number of accesses exceeds a threshold value. In an embodiment, the word line access number that is compared to the threshold value may be obtained by tracking and storing the number of accesses to the word lines of the memory device 1 for each word line. The register 120 configured to store the word line access number may be relatively small.

In an embodiment, an adjacent word line may be defined as the one word line next to the word line corresponding to the requested address. In an embodiment, an adjacent word line may be defined as the two word lines next to a word line corresponding to a requested address. In an embodiment, an adjacent word line may indicate word lines disposed within a predetermined range within the word line associated with the requested address. The predetermined range may, for example, include the one or two word lines next to the word line corresponding to a requested address.

The predetermined range may, for example, may include eight, sixteen, or another number of word lines disposed next to a selected word line, where the selected word line is associated with the requested address. The number and selection of adjacent word lines may vary based on an address scrambling method for the memory cell array 2 associated with the requested address.

The operation to restore data is not limited to a specific type of operation. For example, when the semiconductor memory device 1 is a nonvolatile memory device such as for example a DRAM device, the operation to restore data may be performed as a part of an operation to activate adjacent word lines. Such an operation is similar to a refresh operation that is limited to adjacent word lines. In an embodiment, a suitable method may be selected based on the type of the semiconductor memory device 1 to restore data.

In an embodiment, an experimentally set value may be used as the threshold value that is used for the comparison. If the threshold value is set too low, the operation for activating adjacent word lines may occur relatively frequently and impact the performance of the system. If the threshold value is set too high, damage may occur to data as a result of word line disturbances.

The threshold value may be set based on a consideration of one or more elements that may cause word line disturbances. The one or more elements may include, but are not limited to, the number of successive accesses to adjacent word lines, a refresh period, and word line access distribution within the semiconductor memory device 1.

In an embodiment, the number of accesses to a word line is stored in the register 120. The row access controller 110 may access the register 120 to determine the number of accesses to a word line.

The row access controller 110 may access the register 120 to update or reset the number of accesses to a word line or to invalidate the information on the number of accesses.

While the register 120 is shown as being separate from the row access controller 110 in FIG. 1, the register 120 may be included as a part of the row access controller 110.

Upon the receipt of a request for the semiconductor memory device 1 at the memory controller 100, if the row access controller 110 determines that the word line access number associated with the receive request exceeds the threshold value, the row access controller 110 may suspend the process associated with the received request and restore data of the cells coupled to a word line adjacent to the word line associated with the request.

The row access controller 110 may issue a command to a control selector 130 to provide a command and address generated by the row access controller 110 to the semiconductor memory device 1, instead of providing a command and address generated by the command generator 40 to the semiconductor memory device 1.

If the adjacent word lines are not activated, the row access controller 110 may issue a command to the control selector 130 to provide the command and address output by the command controller 40 to the semiconductor memory device 1.

The row access controller 110 suspends the process for the received request, while data is restored in the cells coupled to the adjacent word lines. For this operation, the row access controller 110 may request the arbitration block 30 to suspend the operation using a control signal.

When the activation operation for the adjacent word lines is complete, the row access controller 110 may issue a control signal to the arbitration block 30 to resume the suspended operation.

Figure 2:
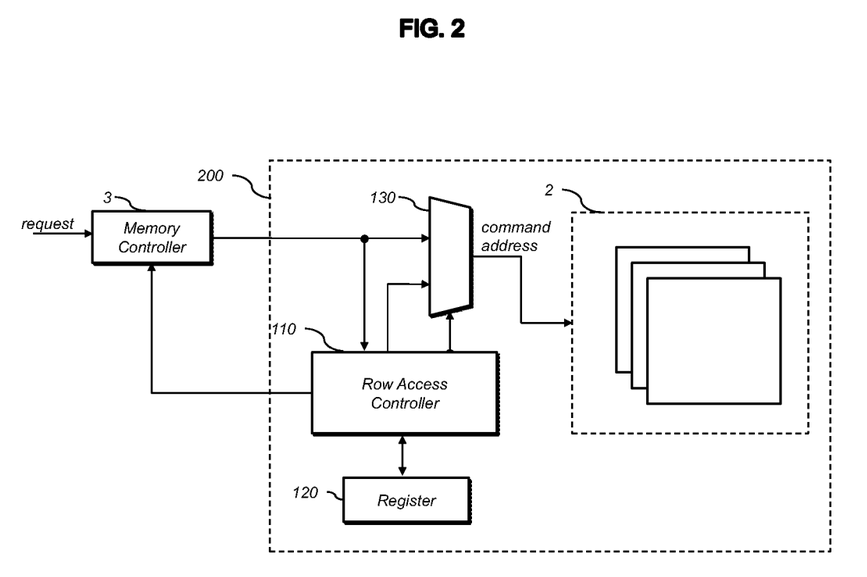
FIG. 2 is a block diagram representation of an embodiment of a semiconductor memory device.

FIG. 2 is a block diagram representation of an embodiment of a semiconductor memory device 200.

While not shown, an embodiment of the semiconductor memory device 200 may include other components that facilitate operations of the semiconductor memory device 200. An example of such an operation includes receiving a command and an address for a memory cell array 2 from a memory controller 3 to input/output data or perform a refresh operation. Referring to FIG. 2, the memory controller 3 may generate a command/address in accordance with an external address and control an operation of inputting/outputting data to/from the memory cell array 2 within the semiconductor device 200. The memory controller 3 may be provided as an independent component, or included as a component of another semiconductor device, such as for example, a processor.

The configuration and operation of the row access controller 110, the register 120, and the control selector 130 are substantially similar to those described with reference to FIG. 1.

In an embodiment, the row access controller 110 at the semiconductor memory device 200 may receive a command/address from the memory controller 3. The register 120 responsively determines the number of times the word line associated with the received address has been accessed, and compares the number of times the word line has been accessed to a threshold value.

When the number of times that the word line has been accessed exceeds the threshold value, the row access controller 110 may generate a command/address for activating an adjacent word line prior to processing a request for the word line corresponding to the requested address.

The row access controller 110 may issue a command to the control selector 130 to provide the command/address associated with the adjacent word line generated by the row access controller 110 to the memory cell array 2.

Upon activation of the adjacent word line, the row access controller 110 may process the request for the word line associated with the address received from the memory controller 3. The row access controller 110 may issue a command to the control selector 130 to provide the command/address received from the memory controller 3 to the memory cell array 2.

The row access controller 110 may provide a control signal to the memory controller 3 to suspend the operation of the memory controller 3. The memory controller 3 may suspend the operation of the arbitration block (not illustrated) and maintain the current request in a queue.

Then, the row access controller 110 may issue a command to the control selector 130 to provide the address and command generated by the row access controller 110 to the memory cell array 2, and activate an adjacent word line.

Then, the row access controller 110 may request the memory controller 3 to resume the operation. The memory controller 3 may responsively resume the operation of the arbitration block at the memory controller 3.

In an embodiment, the semiconductor memory device 200 may include a buffer (not shown,). The buffer may temporarily store a command/address received from the memory controller 3 while the semiconductor memory device 200 manages an activation operation of an adjacent word line.

In this case, the semiconductor memory device 200 may not provide a signal for requesting the memory controller 3 to suspend and/or resume operation.

Instead, the semiconductor memory device 200 may issue a response signal to the memory controller 3. The response signal indicates to the memory controller 3 that the command for the address requested from the memory controller 3 has been processed. The memory controller 3 receives the response signal may responsively provide a command/address for a next request to the semiconductor memory device 200.

Figure 3:
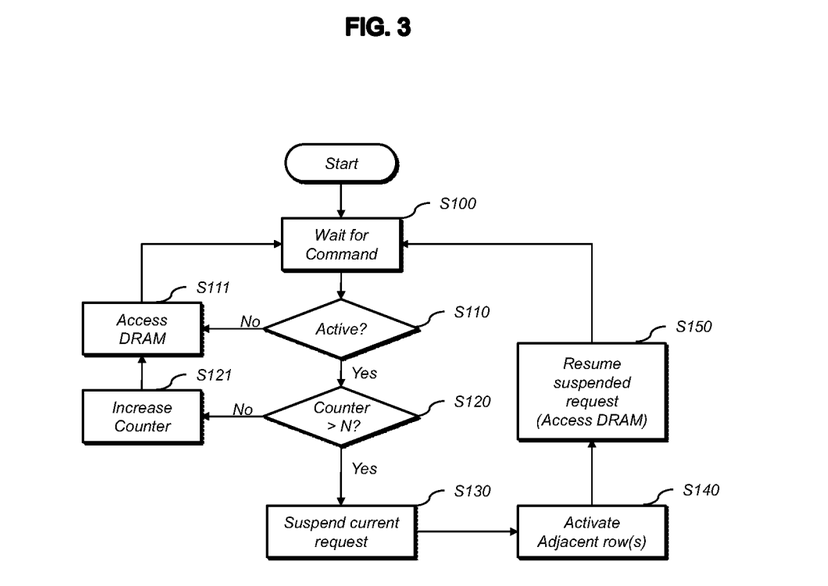
FIG. 3 is a flow chart diagram representation of the operation of an embodiment of the semiconductor devices illustrated in FIGS. 1 and 2.

FIG. 3 is a flow chart representation of an example of the operation of the embodiments of the semiconductor devices illustrated in FIGS. 1 and 2.

A control operation may be performed using the row access controller 110. The row access controller 110 may manage the register 120 for each control operation.

The row access controller 110 may wait for a command at step S100.

The row access controller 110 may determine whether a received command is an active command, at step S110. In an embodiment, the command may include commands used to detect word line toggling. In an embodiment, a command to change a word line from an activated state to a deactivated state may be detected instead of an active command to change a word line from a deactivated state to an activated state.

If the received command is determined to not be an active command at step S110, the row access controller 110 may process a command for the memory cell array 2 at step S111.

If the received command is determined to be an active command at step S110, the row access controller 120 may refer to the register 120 and determine whether the number of times the word line associated with the received request has been accessed exceeds a threshold value at step S120.

If the number of times that the word line associated with the received request has been accessed does not exceed the threshold value, the row access controller 110 may issue a command to the register 120 to increase the number of times that the word line associated with the requested world line has been accessed at step S121, and process the received command for the memory cell array 2 at step S111.

If the number of times that the word line associated with the received request has been accessed exceeds the threshold value, the row access controller 120 may suspend the process for the received command at step S130, and may activate a word line adjacent to the word line corresponding to the received command at step S140.

In an embodiment, an adjacent word line may refer to a word line next to a word line corresponding to a received command. In an embodiment, an adjacent word line may refer to two word lines next to a word line corresponding to a received command. In an embodiment, an adjacent word line may indicate word lines positioned within a predetermined range with respect to a word line associated with a received command. For example, an adjacent word line may include the eight word lines, sixteen word lines, or any other number of word lines disposed around the word line associated with a received command. The number of adjacent word lines may vary depending on an address scrambling method for the memory cell array 2.

At step S130 suspending the process for the received command may be performed when the row access controller 110 issues a request to suspend the operation of the arbitration block 30 in the embodiment illustrated in FIG. 1.

At the step S140, the operation of activating the adjacent word line may include an operation of reproducing data of the cells coupled to the adjacent word line. In the case of DRAM, the step S140 may be an operation of refreshing the adjacent word line.

Following the activation of the adjacent word line at step S140, the processing of the suspended received command may be resumed at step S150.

In an embodiment, the suspended received command may not be processed immediately following the implementation of the step S140 but may be maintained in the command queue, and processed at step S111 of the next loop.

The row access controller 110 may issue a command to the register 120 to reset the counter value to zero, following the activation of the adjacent word line at the step S140.

When the semiconductor memory device 1 is a volatile memory device, such as for example a DRAM, a refresh operation is generally performed for the entire or partial region of the memory cell array 2 at a predetermined interval. When the refresh operation is performed, the counter value of the register 120 may be reset.

In the above-described embodiment, the number of accesses to the entire region of the memory cell array 2 may be tracked as a single value, and compared to a threshold value.

In an embodiment, the memory cell array 2 may be divided into a plurality of different regions, and the number of accesses to each individual region may be compared to the threshold value. In this case, the number of accesses to each region may be managed individually. The threshold value may be set to be the same value for each region or set to be different value for each region depending on the size of the region.

Figure 4:
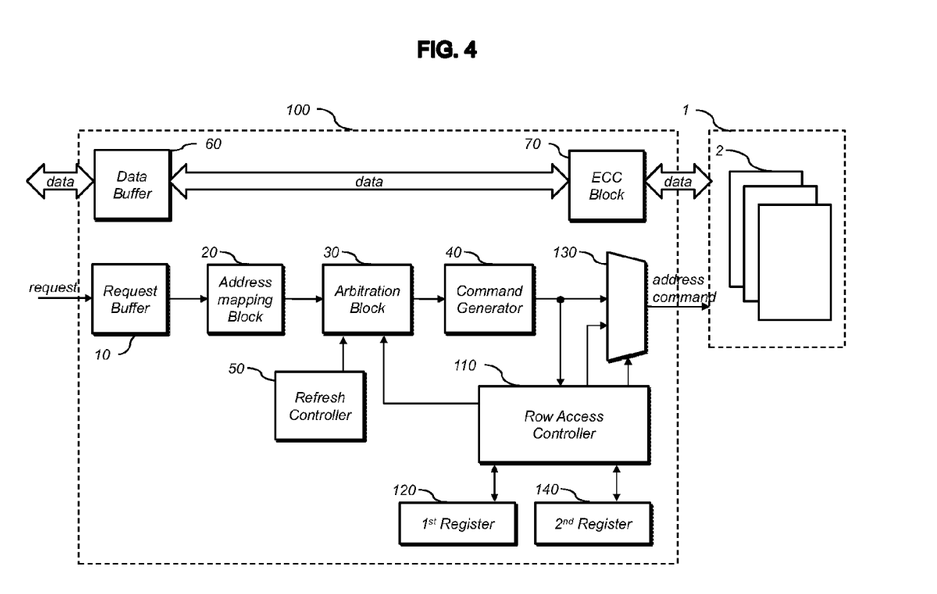
FIG. 4 is a block diagram representation of an embodiment of a memory controller.
Figure 5:
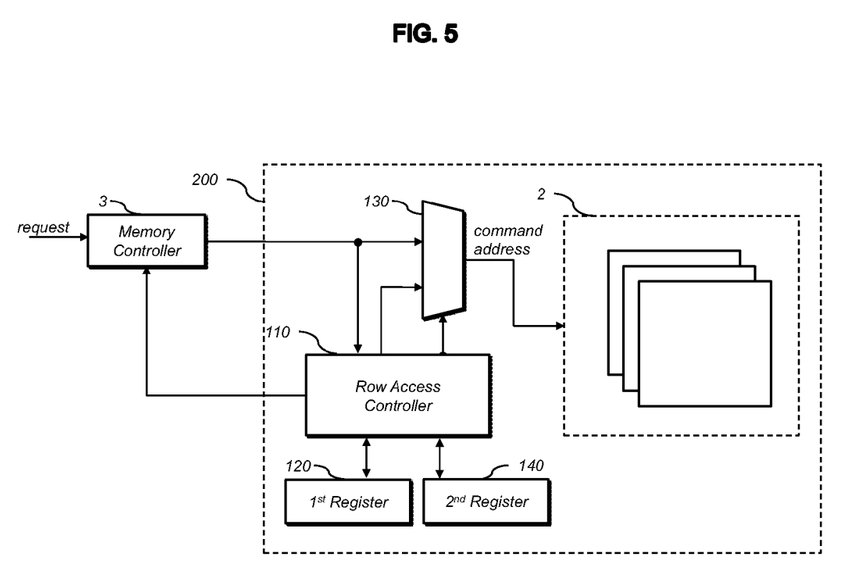
FIG. 5 is a block diagram representation of an embodiment of a semiconductor memory device.

Referring to FIGS. 4 and 5 embodiments of semiconductor devices are shown.

In the embodiments of the semiconductor devices described with reference to FIGS. 4 and 5 the memory cell array 2 is divided into a plurality of groups, and the number of accesses to each group is individually tracked, stored and compared to a threshold value associated with that region.

Figure 6:
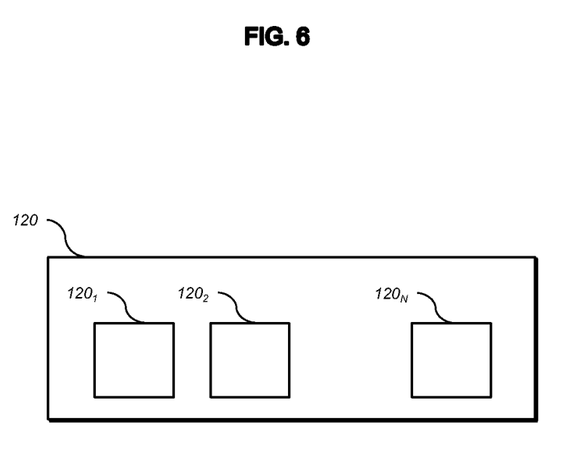
FIG. 6 is a block diagram representation of a first register included in embodiments of the semiconductor devices of FIGS. 4 and 5.

Referring to FIG. 6 the first register 120 included in embodiments of the semiconductor devices of FIGS. 4 and 5 is shown.

The first register 120 includes a plurality of lower registers $120_1$, $120_2$, $120_N$. The total number of word lines in the memory cell array 2 is subdivided into a number of different groups. A lower register is associated with each of the different groups of word lines. The lower register tracks the number of times that any word line in the group associated with that lower register is accessed.

When a word line access command is performed, the row access controller 110 compares the number of times that any word line in the group including the word line associated with the received request has been accessed stored in the lower register $120_1$ to the threshold value.

The grouping of the memory cell array 2 may be determined using a number of different techniques. For example, when the memory device 1 includes four banks, the register 120 may include four lower registers, where each of the four lower registers corresponds to one of the four the banks. Each of the lower registers tracks and the number of accesses to the word lines included in the bank associated with that lower register, and stores the tracked access number.

While an embodiment where the memory cell array 2 is grouped on the basis of banks has been described, the memory device 1 may be divided into a plurality of groups using alternative methods. When the number of lower registers is increased by the total number of word line addresses, the storage space of the register 120 may be increased.

In the embodiments of FIGS. 4 and 5, a threshold value used for comparison to the number of word line accesses for each group may have a different value from the threshold value used in the embodiments described with reference to FIGS. 1 and 2.

If the number of accesses to word lines in a bank including the word line associated with a received request exceeds the threshold value for that bank in the semiconductor devices illustrated in FIGS. 4 and 5, the process for the received request may be suspended. A word line adjacent to the requested word line may be activated, and the suspended process for the received request may be resumed following the activation of the adjacent word line in a manner that is similar to the process described with reference to FIG. 3.

The operations of the row access controller 110 and the selector 130 may be performed in substantially the same manner as described above.

In an embodiment, an activation operation for an adjacent word line may be performed when a bank is idle. This may prevent the degradation of performance that may occur when a process for a received request is suspended.

The second register 140 shown in FIGS. 4 and 5 stores address and bank information associated with a word line where a refresh operation is to be performed when the associated bank is in an idle state.

Referring to FIGS. 4 and 5, the second register 140 is separate from the row access controller 110 and the first register 120. The second register 140 may be included in the same chip with the row access controller 110 and/or the first register 120.

Figure 7:
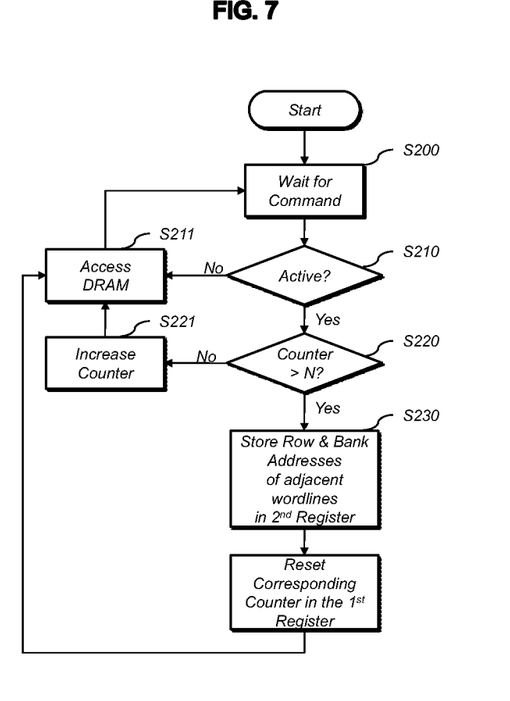
FIGS. 7 and 8 are flowchart diagram representations of the operation of embodiments of the semiconductor devices illustrated in FIGS. 4 and 5.

Referring to FIG. 7, a flowchart diagram representation of the operation of embodiments of the semiconductor devices illustrated in FIGS. 4 and 5 is shown. The operation relates to the storing of addresses that are refreshed in an idle state in the second register 140. The operation is managed by the row access controller 110.

The row access controller 110 may wait to receive a command at step S200.

When a command is received, the row access controller 110 may determine whether the received command is an active command at step S210.

If the received command is not an active command, the row access controller 110 may access the memory cell array in accordance with the command and process the command at step S211.

If the received command is an active command, the row access controller 110 may access a sub storage unit corresponding to the active command in the first register 120, and determine whether the number of word line accesses associated with the received command exceeds the threshold value at step S220.

If the number of word line accesses does not exceed the threshold value, the row access controller 110 may store the number in the corresponding sub storage unit, and access the corresponding memory cell array to perform the active command at steps S221 and S211.

If the number of word line accesses exceeds the threshold value, the row access controller 110 may store the address and bank information of adjacent word lines in the second register 140 at step S230. The first register 120 may reset the number in the corresponding sub storage unit following the storage of the address and bank information.

Then, the row access controller 110 may access the memory cell array according to the received active command, at step S211 and wait for the next command at step S200.

Figure 8:
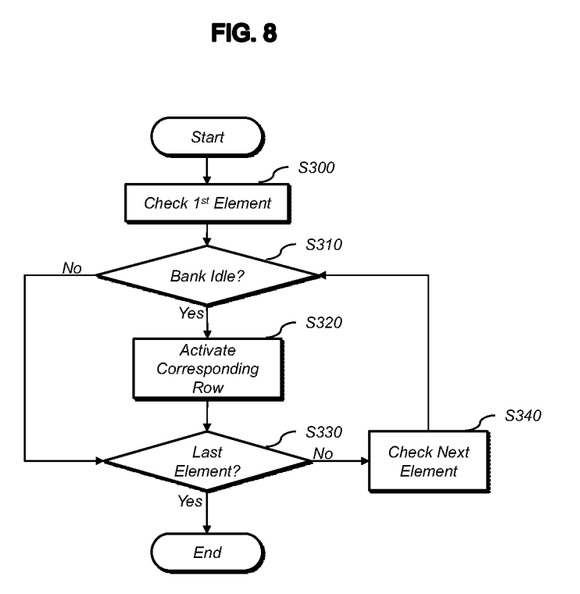

Referring to FIG. 8 a flowchart diagram representation of the operation of the embodiments of the semiconductor device illustrated in FIGS. 4 and 5 is shown. The operation relates to the activation of a word line in an idle state.

The row access controller 110 may perform the control operations detailed in the flowchart shown in FIG. 8.

The row access controller 110 may access the second register 140 and check a first element at step S300.

The row access controller 110 may determine whether a bank corresponding to the element is idle at step S310. If the bank is not idle, the row access controller 110 determines whether the checked element is the last element at step S330. If the checked element is not the last element, the row access controller 110 may check a next element at steps S340.

If a bank corresponding to the element is idle, the row access controller 110 may generate a command to activate a word line by referring to a row address and a bank address of the corresponding element, and issue a command to the control selector 130 to provide the generated command to the memory cell array 2 at step S320.

The row access controller 110 of FIG. 4 may provide a control signal to the arbitration block 30 to suspend the operation, in order to prevent another command from being provided to the corresponding bank.

The row access controller 110 may check the next element at steps S330 and S340, and repeat the above-described operation.

The control operation of FIG. 8 may be performed independently of the control operation of FIG. 7. For example, the row access controller 110 may perform the control operation of FIG. 8 by accessing the second register 140 at a predetermined time interval.

In an embodiment, the row access controller 110 may perform the operation of FIG. 8 at an arbitrary time at which a new operation such as step S200 of FIG. 7 may be performed, while waiting for a command.

In the embodiment of FIGS. 7 and 8, when a bank is idle, the row access controller 110 may activate a word line, where information associated with that word line is stored in the second register 140. Since the process for the received command will not be suspended, the degradation of operation performance may be reduced.

Various embodiments of the semiconductor device may prevent the damage of cell data, and may reduce the size of the storage space for monitoring the number of accesses to word lines.

Figure 9:
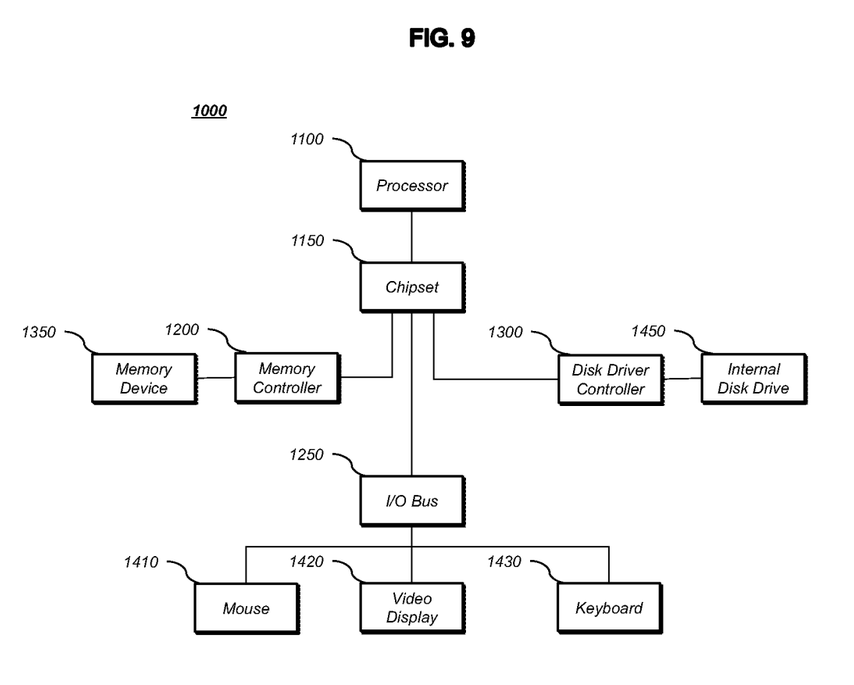
FIG. 9 is a block diagram representation of a system including an embodiment of the memory controller and the semiconductor memory device.

Referring to FIG. 9, a block diagram representation of a system 1000 including an embodiment of a memory system is shown. The system 1000 includes one or more semiconductor memory devices 1350 and a memory controller 1200. In an embodiment, the memory system includes a memory controller 1200, a power supply and at least one semiconductor memory device 1350. In an embodiment, the memory controller 1200 is substantially similar to the memory controller shown in FIG. 1. In an embodiment, the memory controller 1200 is substantially similar to the memory controller shown in FIG. 4. In an embodiment, the semiconductor memory device 1350 is substantially similar to the semiconductor memory device shown in FIG. 2. In an embodiment, the semiconductor memory device 1350 is substantially similar to the semiconductor memory device shown in FIG. 5.

In an embodiment, the memory controller 1200 includes a storage unit configured to store a number of times a first command has been provided to a memory cell array, a control unit configured to generate a second command operable to activate at least one word line in the memory cell array based on a comparison of the number stored at the storage unit with a threshold value, when the first command is received, and a selection unit configured to select one of the first and second commands based on a result of the comparison and transmit the selected command to the memory cell array.

In an embodiment, the semiconductor memory device 1350 1200 includes a storage unit configured to store a number of times a first command has been provided to a memory cell array, a control unit configured to generate a second command operable to activate at least one word line in the memory cell array based on a comparison of the number stored at the storage unit with a threshold value, when the first command is received, and a selection unit configured to select one of the first and second commands based on a result of the comparison and transmit the selected command to the memory cell array.

In an embodiment, the semiconductor memory device includes a memory cell array and the memory controller 1350 includes a storage unit configured to store a number of times a first command has been provided to the memory cell array from a memory controller, a control unit configured to generate a second command operable to activate at least one word line in the memory cell array based on a comparison of the number stored at the storage unit with a threshold value, and a selection unit configured to select one of the first and second commands based on a result of the comparison and transmit the selected command to the memory cell array.

In an embodiment, the semiconductor memory device 1350 includes a memory cell array, a storage unit configured to store a number of times a first command has been provided to the memory cell array from a memory controller, a control unit configured to generate a second command operable to activate at least one word line in the memory cell array based on a comparison of the number stored at the storage unit with a threshold value, and a selection unit configured to select one of the first and second commands based on a result of the comparison and transmit the selected command to the memory cell array.

Examples of the semiconductor memory device 1350 include, but are not limited to, volatile memory, nonvolatile memory, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 9 is merely one example of a system. In alternate embodiments, such as cellular phones or digital cameras, the components may differ from the embodiment shown in FIG. 9.

While certain embodiments have been described above, it will be understood to those skilled in the art that the embodiments described are by way of example only. Accordingly, a system including embodiments of the memory controller and the semiconductor memory device described herein should not be limited based on the described embodiments. Rather, a system including a memory controller and a semiconductor memory device described herein should only be limited in light of the claims that follow when taken in conjunction with the above description and accompanying drawings.

What is claimed is:

1. A semiconductor device comprising:
a storage unit configured to store a number of times a first command has been provided to a memory cell array;
a control unit configured to generate a second command operable to activate at least one word line in the memory cell array based on a comparison of the number stored at the storage unit with a threshold value, when the first command is received; and
a selection unit configured to select one of the first command and the second command based on a result of the comparison and transmit the selected command to the memory cell array,
wherein the first command comprises a command to activate a first word line in the memory cell array.

2. The semiconductor device of claim 1, wherein the control unit is configured to generate the second command when the number stored at the storage unit is greater than the threshold value, and to issue a command to the selection unit to provide the second command to the memory cell array.

3. The semiconductor device of claim 2, wherein the at least one word line is adjacent to the first word line.

4. The semiconductor device of claim 2, wherein the control unit is configured to issue a command to the selection unit to provide the first command to the memory cell array following the performance of the second command.

5. The semiconductor device of claim 4, wherein the control unit comprises a buffer configured to temporarily store the first command.

6. The semiconductor device of claim 4, further comprising:
an arbitration block configured to determine the order of read requests and write requests transferred to the memory cell array from a processor core; and
a command generator configured to generate the first command in response to a request selected by the arbitration block.

7. The semiconductor device of claim 6, wherein the control unit is configured to suspend operation of the arbitration block prior to the performance of the second command, and to resume operation of the arbitration block following the performance of the second command.

8. The semiconductor device of claim 1, wherein the storage unit comprises a plurality of sub storage units and the memory cell array is divided into plurality of groups wherein each of sub storage unit is associated with one of the groups and each of the sub storage units stores the numbers of times the first command is received for any word line in the associated group in the memory cell array.

9. The semiconductor device of claim 8, wherein the control unit is configured to compare a value stored at a sub storage unit corresponding to the group including the word line associated with the received first command to the threshold value.

10. The semiconductor device of claim 9, further comprising a second storage unit,
wherein the control unit is configured to store group and address information of a word line associated with the second command in the second storage unit, when the value stored at the sub storage unit exceeds the threshold value.

11. The semiconductor device of claim 10, wherein the control unit is configured to generate the second command for the word line when the group associated with the word line address stored in the second storage unit is idle, and to issue a command to the selection unit to transmit the second command to the memory cell array.

12. The semiconductor device of claim 11, wherein the plurality of groups comprises a plurality of unit banks.

13. The semiconductor device of claim 12, further comprising:
an arbitration block configured to determine the order of read requests and write requests associated with the memory cell array from a processor core; and
a command generator configured to generate the first command for a request selected by the arbitration block.

14. The semiconductor device of claim 13, wherein the control unit is configured to suspend operation of the arbitration block prior to the performance of the second command, and to resume operation of the arbitration block following the performance of the second command.

15. A semiconductor memory device comprising:
a memory cell array;
a storage unit configured to store a number of times a first command has been provided to the memory cell array from a memory controller;
a control unit configured to generate a second command operable to activate at least one word line in the memory cell array based on a comparison of the number stored at the storage unit with a threshold value; and
a selection unit configured to select one of the first command and the second command based on a result of the comparison and transmit the selected command to the memory cell array,
wherein the first command comprises a command operable to activate a first word line in the memory cell array.

16. The semiconductor memory device of claim 15, wherein the control unit is configured to issue a command to the selection unit to provide the second command to the memory cell array when the number stored at the storage unit exceeds the threshold value.

17. The semiconductor memory device of claim 16, wherein the control unit is configured to issue a command to the selection unit to provide the first command to the memory cell array following the performance of the second command.

18. The semiconductor memory device of claim 17, wherein the control unit is configured to suspend operation of the memory controller prior to the performance of the second command, and to resume operation of the memory controller following the performance of the second command.

19. The semiconductor memory device of claim 18, wherein the at least one word line is adjacent to the first word line.

20. The semiconductor memory device of claim 15, wherein the storage unit comprises a plurality of sub storage units, and the memory cell array is divided into a plurality of groups, wherein each of the plurality of sub storage units is associated with one of the plurality of groups and each sub storage unit stores the number of times the first command was received for the associated group.

21. The semiconductor memory device of claim 20, wherein the control unit is configured to compare a number stored at a sub storage unit associated with a group including a word line corresponding to the received first command with the threshold value.

22. The semiconductor memory device of claim 21, further comprising a second storage unit, wherein the control unit is configured to store group and address information associated with word line associated with the second command in the second storage unit when the number stored at the sub storage unit is greater than the threshold value.

23. The semiconductor memory device of claim 22, wherein the control unit is configured to generate the second command for the word line when the group associated with that word is idle, and to issue a command to the selection unit to provide the second command to the memory cell array.

* * * * *